United States Patent [19]

Nagel

[11] 4,130,725
[45] Dec. 19, 1978

[54] SPLIT-COIL SPEAKER WITH DIRECT COUPLING

[75] Inventor: Martin J. Nagel, Russell Township, Geauga County, Ohio

[73] Assignee: Tenna Corporation, Warrensville Heights, Ohio

[21] Appl. No.: 746,796

[22] Filed: Dec. 2, 1976

[51] Int. Cl.² ........................ H04R 3/00; H04R 9/04
[52] U.S. Cl. ........................... 179/1 A; 179/115.5 DV
[58] Field of Search ............ 179/115.5 DV, 1 A, 1 F, 179/115.5 VC

[56] References Cited

U.S. PATENT DOCUMENTS

| | | | |
|---|---|---|---|
| 2,007,748 | 7/1935 | Olson | 179/115.5 DV |
| 2,205,365 | 6/1940 | Schwaen | 179/115.5 DV |
| 3,686,446 | 8/1972 | Manger | 179/115.5 DV |

*Primary Examiner*—George G. Stellar
*Attorney, Agent, or Firm*—Watts, Hoffmann, Fisher & Heinke Co.

[57] ABSTRACT

A high-efficiency loudspeaker with a split voice coil and directly coupled push-pull audio amplifier circuit, especially useful when energized through a single-ended, low voltage, external power source to increase the output of a relatively low-power audio amplifier without undue distortion.

8 Claims, 5 Drawing Figures

SPLIT-COIL SPEAKER WITH DIRECT COUPLING

BACKGROUND OF THE INVENTION

1. Field of the Invention

This invention relates to a split voice coil and directly coupled push-pull amplifier circuit for a speaker.

2. Prior Art

Directly coupled split voice coils for audio speakers have been used with push-pull circuits. See, for example, U.S. Pat. No. 2,959,640 issued to J. B. Schultz. Circuits such as that shown by the Schultz patent and directly coupled to a speaker require stabilizing; i.e., a feedback circuit for the control of gain. In addition, to applicant's knowledge, direct-coupled split coil speakers have not been constructed to obtain maximum operating efficiency for a given speaker magnet size. For example, a relatively long excursion or travel of a speaker coil is advantageous in producing loud sounds; yet, the typical excursion of a speaker coil is kept small compared to the length of the magnetic gap in which it moves because inefficiencies result where portions of the energized coil are outside of the magnetic flux path, and distortion results if the amount of the coil within the flux path changes. Moreover, the magnet depth itself, which defines the gap length, is usually kept small because of the substantial expense of large magnets.

SUMMARY OF THE INVENTION

The present invention provides a speaker of high fidelity output with an improved split coil arrangement for increasing the efficiency with which the speaker is driven, for a given voice coil magnet size. The present invention also provides, in combination with the speaker, a directly coupled push-pull amplifier circuit for driving the split coil.

The speaker voice coil is a single layer helix, split by a center tap to provide two tandem coils or coil halves, and located within an annular gap of the speaker magnet; i.e., between a central cylindrical core and a surrounding annular permanent magnet end plate of opposite magnetic polarity. The total axial length of the split coil is equal to the depth of the permanent magnet end plate of the speaker, or preferably is just enough longer to take advantage of the fringing of the useful magnetic field or flux that extends beyond the magnet surfaces forming the gap. The entire split coil is located essentially within the confines of the magnetic field when the coil is in a neutral position or unenergized condition. Each half of the coil is wound so that when either half is energized by associated circuitry to which it is coupled, the energized coil half will be driven further into the magnetic field. Return movement of the coil to a neutral position is through a conventional spring-applied biasing force. As a result of this construction, both energized coil portions stay completely within the magnetic field when energized. This avoids the loss of efficiency that results when an energized portion of a coil is at some time partially out of the magnetic field. Further, with the coils in tandem, the width of the magnetic gap of the speaker magnet can be minimized, improving efficiency.

In a preferred arrangement, in which the speaker is used with a power amplifier, the split coil is driven by a directly coupled high-fidelity push-pull circuit without signal or stabilizing feedback circuitry. Two transistor current amplifiers are coupled each to one half of the speaker coil as followers without voltage gain, the gain of the circuit coming rather from the turns ratio of a transformer and being essentially independent of the transistor parameters. Good performance is achieved with few components, keeping costs relatively low.

The present invention finds particular use as a high power speaker and amplifier combination when connected to the output of a relatively low-power amplifier and energized through an external, low-voltage, single-ended, power source to increase the amplifier output. It is particularly useful with car radios, tape players, citizens band receivers and similar sound products, which operate from low-voltage, single-ended, power supplies, such as automotive batteries, and serves to greatly increase the volume without undue distortion.

DESCRIPTION OF A PREFERRED EMBODIMENT

Figure 1:
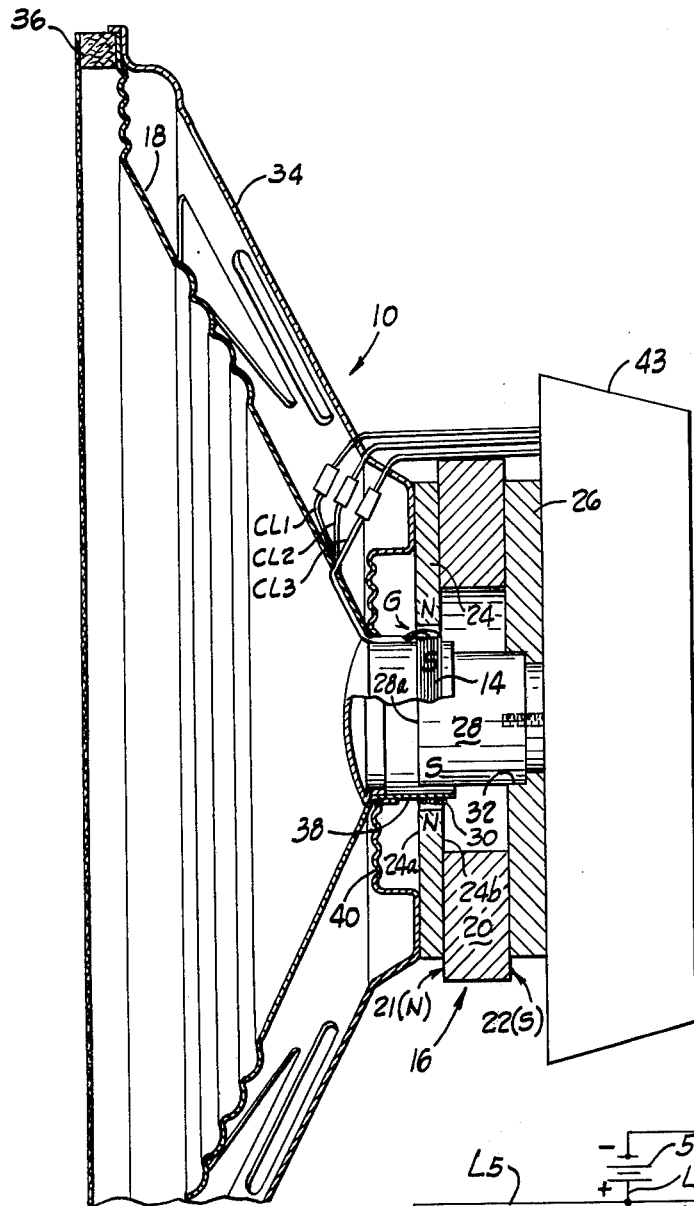
FIG. 1 is a sectional view, with parts in elevation, illustrating a loudspeaker with a split voice coil, constructed in accordance with the present invention.
Figure 2A:
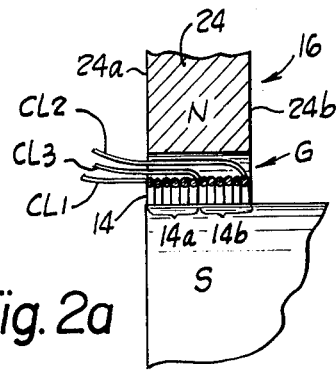
FIGS. 2a, 2b and 2c are enlarged sectional views of the speaker coil and speaker magnet of FIG. 1, diagrammatically illustrating the relationship between the speaker coil and the magnet when the coil is unenergized (FIG. 2a), when one-half of the coil to the right hand side of the drawing is energized (FIG. 2b), and when one-half of the coil to the left hand side of the drawing is energized (FIG. 2c)
Figure 2B:
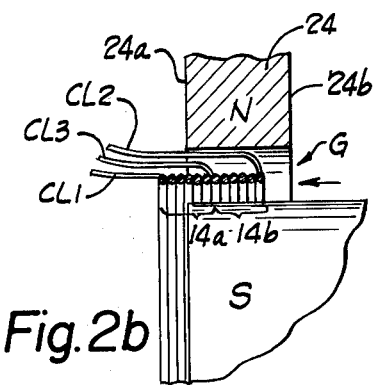
Figure 2C:
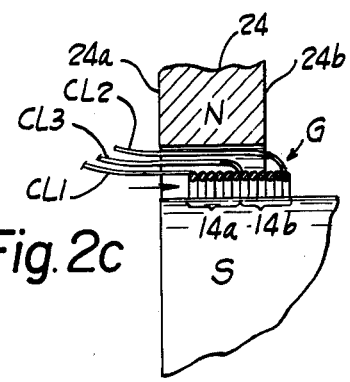
Figure 3:
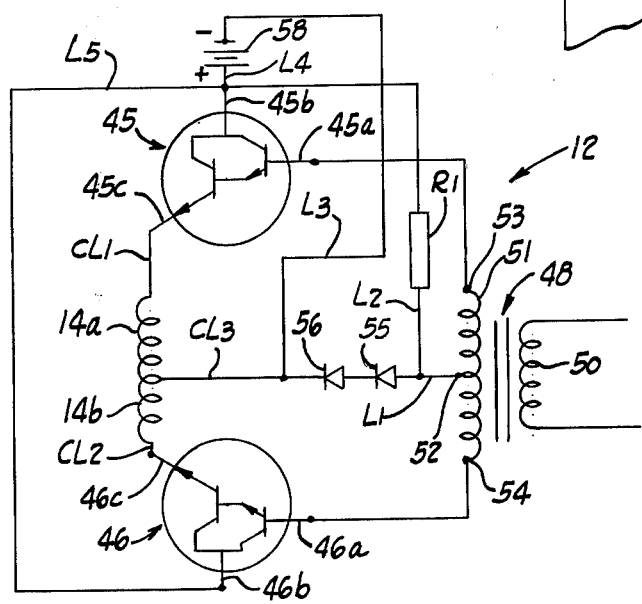
FIG. 3 is a schematic drawing of a preferred circuit for energizing the coil halves of the speaker coil shown in FIGS. 1 and 2.

The present invention is embodied in an improved speaker 10 shown in FIGS. 1 and 2 of the drawings, and in the combination of the improved speaker 10 and a directly coupled amplifier circuit 12, shown in FIG. 3, in which current amplification is obtained from power supplied from an external source.

The speaker 10 utilizes a divided or so-called split driving coil 14 movable relative to a permanent magnet 16, to drive a cone 18 and is constructed to maximize the linear excursion of the coil 14 for a given magnet size and thereby produce a high output level efficiently and without undue distortion.

The permanent magnet assembly 16 is comprised of a magnetic annulus 20 with north and south pole faces 21, 22, respectively, soft iron front and back end plates 24, 26, and an iron core 28, which provide a magnetic circuit path. Both plates 24, 26 are annular. A central circular opening 30 in the front end plate 24 is slightly larger in diameter than the coil 14, and the core 28 is slightly smaller in diameter than the inside diameter of the coil and supporting form. One end 28a of the core 28 is essentially flush with the front surface 24a of the front end plate 24. The opposite end of the core 28 is received with an interference fit in a central aperture 32 of the end plate 26. This construction provides an annular gap G, with a depth equal to the thickness of the plate 24 and in which the coil 14 is located. The plate 24 forms a north magnetic pole about the outer periphery of the gap G and the core 28 forms a south magnetic pole, with the magnetic flux passing across the gap G along the entire length or depth.

The speaker 10 has a conventional rigid frame 34, for example, of sheet metal. The wide end or front of the cone 18 is secured at the front of the frame 34 and the permanent magnet assembly 16 is secured to the back of the frame 34. A mounting gasket 36 is secured to the cone at the front of the frame. A cylindrical coil form 38 is attached to the apex of the cone 18 and extends rearwardly into the permanent magnet assembly 16. A spider 40 is attached between the coil form 38 and the frame 34, locating the coil form within the annular gap G of the permanent magnet assembly and serving as a spring return, to urge the coil form in a direction along the axis of the form, back to the neutral position shown in FIGS. 1 and 2a, after an excursion.

The coil 14 is a continuous wire strand with turns wound around the coil form 38 to form a single layer helix. The coil has two end leads CL1, CL2 and a center tap or lead CL3, which divides the length of the coil into two half coils 14a, 14b that are functionally independent, separate, coils and that move together in tandem in a longitudinal direction (i.e., axially of the coil helix). For purposes of description, portions 14a and 14b will be referred to as separate coils. Movement of the combined coil 14 and coil form 38 in response to energization of either coil 14a, 14b drives the cone 18.

As best shown in FIG. 2a, the combined length of the coils 14a, 14b is essentially equal to the thickness of the plate 24, which defines the depth of the gap G. The combined length of the coils in the axial direction may advantageously be slightly longer than the depth of the gap G to correspond with the useful field of the magnetic flux, which is slightly greater in its extent than the thickness of the plate 24, due to a slight fringing in the gap area.

When neither coil 14a, 14b is energized, both are located by the spider 40 precisely within the confines of the magnetic field, as shown in FIG. 2a. Thus, when the turns of either coil 14a, 14b are electrically energized, they are entirely within the magnetic flux. The direction in which the turns are wound and the direction of current flow through the turns are such that the energization of either coil 14a or 14b moves that coil in a direction further into the gap G. Thus, as shown in FIG. 2b, when coil 14b is energized, it moves from its position adjacent the back surface 24b further into the gap G. At maximum excursion, the coil 14a will be beyond the gap, and the coil 14b will be located adjacent the front surface 24a of the plate 24. When the coil 14b is de-energized, it is returned to the neutral position by the spider 40. Current flow through the coil 14a moves the coil from the neutral position of FIG. 2a in the opposite direction, as shown in FIG. 2c, so that the coil 14a is moved further into the gap G and the unergized coil 14b extends beyond the surface 24b.

A large linear excursion of the coils 14a, 14b is possible with high efficiency, because all energized windings of each coil are continually within the magnetic flux as they move a distance equal to the full axial length of the coil. Additional efficiency is achieved by locating all turns of each coil in one helix (i.e., a single layer) so the width of the gap G can be minimized.

The amplifier circuit 12 shown diagrammatically in FIG. 3 is housed by a receptacle 43 carried by the magnet assembly 16. The circuit is a Class B push-pull circuit in which each half 14a, 14b of the split speaker coil is directly coupled to a separate emitter-follower coupled current amplifier 45, 46. This circuit eliminates the need for an output transformer and requires no signal or stabilizing feedback circuitry.

The circuit 12 is comprised of an input transformer 48 with a primary coil 50 and a secondary coil 51 having a center tap 52. The primary coil 50 is connected to the signal output from a radio, tape player, or other amplifier (not shown). The secondary coil 51 is connected at one end 53 to the amplifier 45; and at its other end 54 to the amplifier 46. Both amplifiers 45, 46 as shown, are Darlington amplifiers, each having a base 45a, 46a, a collector 45b, 46b, and an emitter 45c, 46c. The coil end 53 is connected to the base 45a, and the coil end 54 is connected to the base 46a.

The center tap 52 of the secondary winding 51 is connected to ground or the negative terminal of a power source, such as a battery 58, through lines L1, L3 and through two diodes 55, 56, which produce a voltage drop essentially equal to the base-to-emitter drop of the two transistors that comprise each of the Darlington amplifiers 45, 46. The center tap 52 is also connected through a line L2 and a resistor R1, to a power source, such as the positive terminal of the battery 58. This circuit applies a forward bias to the bases 45a, 46a, through the secondary coil 51, so that the amplifiers 45, 46 will conduct immediately upon application of any signal voltage.

Coil lead CL1 from the coil 14a is connected to the emitter 45c of the amplifier 45, and the coil lead CL2 is connected to the emitter 46c of the amplifier 46. The center tap lead CL3 common to both coils 14a, 14b is connected to the negative terminal of the battery 58 through the line L3.

Each collector 45b, 46b of the amplifiers is connected to the power source 58, i.e., to the positive terminal of the battery in the embodiment shown, through lines L4 and L5.

In operation, in the absence of an input signal at the transformer primary 50, no output signal is produced in the coils 14a, 14b. A small bias current through lines CL1 and CL2 produces fields in coils 14a, 14b in a manner to cancel each other so no displacement of the coils results. Each half of the circuit, associated with one of the amplifiers 45, 46, conducts when a positive signal is applied to the amplifier through the secondary winding 51 of the input transformer 48. The current flow is amplified by the Darlington amplifiers 45, 46, each of which receives power from the external source 58.

When each amplifier 45, 46 conducts, one of the split speaker coils 14a, 14b is energized, driving that coil in a direction into the gap G of the permanent magnet 16. When the input current to the transformer 48 varies, it will cause current to flow in one of two directions through the secondary winding 51. When current flows to the base 45a, the amplifier 45 conducts and directly energizes the coupled coil 14a. At the same time, no current flows to the base 46a, because when the polarity at the end 53 of the coil 51 is positive with respect to the center tap 52, the polarity at the end 54 is negative. When the input signal is reversed, causing current to be applied to the base 46a, the amplifier 46 directly energizes the coupled coil 14b.

By way of a specific example, when the speaker 10 is used with an automobile radio to amplify the output of the radio for greater sound, the circuit 12 is connected to the automobile battery. Typically, the so-called 12 volt battery provides 14.4 volts DC and, as shown in FIG. 3, is connected to the collector electrodes 45b, 46b. A suitable transformer 48 for the circuit 12 has a turns ratio of 1:4 (primary to secondary coils). Considering each half of the secondary winding, the transformer will provide twice the input voltage to each amplifier 45, 46. The speaker coil 14 is constructed to provide a resistance of 2 ohms for each coil 14a, 14b as compared with the 8 ohm resistance of many typical speakers. As a result, the circuit 12 provides a theoretical power amplification increase of 16 times the input signal. In actual practice, an amplification of approximately ten to twelve times the input signal is achieved.

Also by way of example, 40 volt, 10 amp. silicon Darlington transistors are used as the amplifiers 45, 46, which provide current gain of 1,000 times or greater. The resistor R1 establishing the biasing current to the amplifiers is a one-half watt, 3900 ohm resistor.

A 6 × 9 inch speaker is suitable for automotive use and a preferred speaker utilizes a ring ceramic magnet with a soft iron core and a voice coil with a diameter of 1 inch wound on a suitable coil form. The width of the air gap G is suitably 0.050 inch and the length of the gap and thickness of the end plate 24 is suitably 0.25 inch. Each coil 14a, 14b is ⅛ inch in length where the gap G is 0.25 inch in length or depth.

While a preferred embodiment of the present invention has been described in detail, it will be apparent that various modifications and alterations may be made therein without departing from the spirit and scope of the invention set forth in the claims. For example, it will be apparent that the various polarities, both electrical and magnetic, indicated in the circuit description can be reversed and the current amplifiers may be of different construction. For example, single transistors may be used in the place of Darlingtons, and vacuum tubes or field-effect transistors may be used in place of transistors or the like. Moreover, the benefits of the coil and speaker construction can be utilized with other than the preferred circuit and also the circuit can be applied to transducers other than speakers.

What is claimed is:

1. A power amplifier and speaker unit comprising a speaker having a cone, a magnet assembly defining a gap across which a magnetic flux extends to form a magnetic field, two wire coils secured in tandem to said cone and movable axially in said gap, said coils having a combined axial length essentially equal to the length of the useful magnetic field in the direction of the gap depth, and means biasing said coils to a location within the extent of the useful magnetic field; and an amplifier circuit directly coupled to said coils for alternately electrically energizing said coils to move each when energized in a direction further into the magnetic field.

2. A loudspeaker and amplifier of the push-pull class B type; said loudspeaker including a speaker cone, means defining an annular magnetic gap substantially narrower than its length and across which magnetic flux extends, two helical coils of wire within the gap secured to the speaker cone, axially aligned and longitudinally displaced one with respect to the other, said coils having a combined length essentially equal to the length of the gap and with electrical leads connected to opposite ends of each coil for electrically energizing the coils, and means locating said coils so their combined length is essentially coextensive with the gap when neither coil is energized; and said amplifier including two transistor amplifiers, one directly coupled to each coil, and an input transformer coupled to a base of each of the transistor amplifiers; said coils and said circuit being so constructed and arranged that energization of either coil moves the energized coil in a direction along the length of the gap so that the energized coil travels further into the gap.

3. The loudspeaker and amplifier as set forth in claim 2 including means to connect said transistor amplifiers directly to an external power source.

4. The loudspeaker and amplifier as set forth in claim 3 wherein the transistor amplifiers are emitter-follower coupled without signal or stabilizing feedback circuitry.

5. In a loudspeaker: a speaker cone; a permanent magnet assembly defining an annular gap that is substantially narrower than its length and across which magnetic flux extends; two essentially identical helical coils of wire within the gap, secured to the speaker cone, axially aligned and longitudinally displaced one with respect to the other, said coils having a combined length essentially equal to the length of the gap; means for electrically coupling each of the two coils to an amplifier circuit for independent electrical energization; and resilient means mechanically locating both coils within the gap when neither coil is energized.

6. The loudspeaker as set forth in claim 5 wherein each coil is formed of a single layer wire helix.

7. The loudspeaker as set forth in claim 5 wherein the maximum low distortion displacement of the coils in each direction of movement is equal to the length of each coil.

8. A power amplifier and transducer unit comprising a transducer, a magnet assembly defining a gap across which a magnetic flux extends to form a magnetic field, two wire coils secured in tandem to said transducer and movable axially in said gap, said coils having a combined axial length essentially equal to the length of the useful magnetic field in the direction of the gap depth, and means biasing said coils to a location within the extent of the useful magnetic field; and an amplifier circuit directly coupled to said coils for alternately electrically energizing said coils to move each when energized in a direction further into the magnetic field.

* * * * *